United States Patent [19]

Simmons

[11] Patent Number: 5,720,827

[45] Date of Patent: Feb. 24, 1998

[54] DESIGN FOR THE FABRICATION OF HIGH EFFICIENCY SOLAR CELLS

[75] Inventor: Joseph H. Simmons, Gainesville, Fla.

[73] Assignee: University of Florida, Gainesville, Fla.

[21] Appl. No.: 684,167

[22] Filed: Jul. 19, 1996

[51] Int. Cl.⁶ .................... H01L 31/04; H01L 31/0384
[52] U.S. Cl. .................. 136/250; 136/249; 136/255; 257/53; 257/64; 257/431; 257/440; 437/4; 437/5; 437/108; 437/109
[58] Field of Search ........................ 136/250, 255, 136/258 PC, 258 AM, 249 TJ; 257/53, 64, 431, 440; 437/4–5, 108–109, 112

[56] References Cited

U.S. PATENT DOCUMENTS

| | | | |
|---|---|---|---|
| 4,152,535 | 5/1979 | Deminet et al. | 136/258 |
| 4,272,641 | 6/1981 | Hanak | 136/249 |
| 4,401,840 | 8/1983 | Chitre | 136/258 |
| 4,433,202 | 2/1984 | Maruyama et al. | 136/255 |
| 4,625,071 | 11/1986 | Delahoy et al. | 136/250 |
| 4,633,030 | 12/1986 | Cook | 136/246 |
| 4,923,524 | 5/1990 | Kiss | 136/250 |
| 4,947,219 | 8/1990 | Boehm | 257/471 |
| 5,213,670 | 5/1993 | Bertagnolli et al. | 204/192.25 |
| 5,215,599 | 6/1993 | Hingorani et al. | 136/255 |
| 5,279,686 | 1/1994 | Nishida | 136/258 |
| 5,319,220 | 6/1994 | Suzuki et al. | 257/77 |

*Primary Examiner*—Aaron Weisstuch
*Attorney, Agent, or Firm*—Quarles & Brady

[57] ABSTRACT

A method and apparatus for a photo-active region for generation of free carriers when a first surface is exposed to optical radiation. The photo-active region includes a conducting transparent matrix and clusters of semiconductor materials embedded within the conducting transparent matrix. The clusters are arranged in the matrix material so as to define at least a first distribution of cluster sizes ranging from those with the highest bandgap energy near a light incident surface of the photo-active region to those with the smallest bandgap energy near an opposite second surface of the photo-active region. Also disclosed is a method and apparatus for a solar cell. The solar cell includes a photo-active region containing a plurality of semiconductor clusters of varying sizes as described.

25 Claims, 6 Drawing Sheets

DESIGN FOR THE FABRICATION OF HIGH EFFICIENCY SOLAR CELLS

BACKGROUND OF THE INVENTION

The present invention relates to a novel design for the fabrication of high efficiency solar cells. Conventional solar cells operate by converting light incident on a photoactive semiconductor region into free electron and hole carriers. Free carriers are units of electrical charge that can be transported in a material to form useful current. In order to generate useable electric energy, an electric field or gradient of chemical potential is commonly applied to the photoactive region in order to drive the free carriers toward negative and positive current electrodes. The electric field can be created by various means including, for example, a rectifying junction in the solar cell. By means of the electric field, the oppositely charged free carriers are diffused to respective electrodes in order to create the photo-voltage and photo-current of the cell. In this manner, solar cells transform light into electricity.

The sun emits light over a broad wavelength range reaching from about 300 nanometers (nm) to about 2200 nm. Maximum solar intensity occurs between 450 and 570 nm respectively, depending on whether the sky is overcast or clear. Conventional solar cells typically consist primarily of silicon, which absorbs light at wavelengths shorter than about 1,120 nm.

Efficiency is the key factor that determines the commercial value of solar cells. Overall solar cell efficiency is defined here as the number of free carriers collected at the electrodes of a solar cell of a given surface area by exposure of the cell to sunlight at a particular predefined intensity level. Such efficiency is a function of several variables, including:

(1) the number of free carriers generated in a given surface area of semiconductor by exposure to sunlight at a predefined intensity level; and (2) the number of photo-excited free carriers which are actually conducted to the electrodes of the solar cell and are therefore available to perform useful work.

It is well known in the art that semiconductors generally absorb light and transform it efficiently into free carriers only at wavelengths near the band-gap of the material. See e.g. U.S. Pat. No. 4,272,641 to Hanak, Col.. 1; U.S. Pat. No. 4,633,030 to Cook, Col. 11. Likewise, it is known that the wavelength of optical radiation is directly related to the energy of its photons. For example, solar radiation in the range from 300 nanometers to 2200 nanometers in wavelength will be comprised of photons ranging in energy from about 4.2 eV to about 0.56 eV, respectively.

Bulk crystalline silicon has a band-gap energy of about 1.1 eV, which is well within the energy range of solar radiation. Likewise, other bulk semiconductor materials used for manufacturing solar cells such as gallium arsenide and germanium, also have band-gap energy levels within this range. In referring to such "bulk" quantities of material, it is generally understood that reference is made to a quantity of material which has a particle size which exceeds about 50 nm in diameter or in thickness.

At wavelengths which are longer than those corresponding to the band-gap of the particular semiconductor material, optical radiation is transmitted through the semiconductor with little absorption. At shorter wavelengths, the light is reflected with only moderate absorption. Due to this limited range of absorption, the maximum theoretical efficiency achievable by a solar cell made from a single type of semiconductor material has previously been understood as being necessarily limited. For example, the maximum theoretical efficiency previously thought to be achievable with solar cells manufactured from conventional silicon has been 23%. In fact, the actual efficiency realized by conventional solar cells is often substantially less than the theoretical efficiency.

In order to correct for the inefficiencies associated with the limited absorption characteristics of conventional solar cells, solar collectors of the prior art have used complex geometries to trap the light so that little of it is reflected. As a result, it has proved possible to achieve efficiencies approaching 17–19%.

Suggestions for improvements in solar cell design, to increase efficiency, have also included the use of two semiconductors of different band-gaps, such as germanium and silicon (germanium has a band-gap at 1,850 nm). See e.g., U.S. Pat. No. 4,272,641 to Hanak, Cols. 1–2. Significantly however, the lattice mismatch between semiconductors such as silicon and germanium is often such as to cause the formation of dislocations and other structural defects. These defects can cause non-radiative recombination of the photo-excited free carriers and reduce the number which reach the electrodes, thus decreasing the total efficiency of the cell.

Furthermore, it is well known in the art that one problem with existing solar cells concerns the transit of free carriers through the semiconductor, to the electrodes. The problem occurs because photo-excited free carriers within the semiconductor can be annihilated in transit to the current collecting electrodes by the nearby absorption of a photon of light and the resultant formation of species of opposite charge. This action decreases the efficiency of the cell and limits the distance that free carriers can travel to an electrode.

Accordingly, it is an object of the invention to provide a new design for the fabrication of a high efficiency photo-absorptive region for use in solar cells. It is a further object of the invention to provide a new design for a solar cell incorporating such a high efficiency photo-absorptive region.

SUMMARY OF THE INVENTION

It has been found that clusters of semiconductor materials which are fabricated in a range of sufficiently small sizes, will display a different band-gap energy as compared to larger bulk material (i.e. material which is larger than about 50 nm in diameter or thickness) of the same substance. More specifically, clusters which are particularly small in size, i.e. 5–200 Angstroms in diameter, have been found to have band-gaps that occur at a shorter wavelength as compared to bulk semiconductors. It has thus been found that the band-gap value of a semiconductor cluster generally varies inversely with the square of the diameter or size of the cluster. Thus, in the case of silicon, the band-gap values may be varied within the range of 1.1 eV (bulk value for silicon) to about 4 eV, by varying the cluster size within the size range of about 100 to 8 Å. These energy levels correspond to the energy levels of photons comprising optical radiation having a wavelength in the range of between about 1,100 nm and 280 nm.

By making use of this effect, a photo-active region is provided which has dramatically improved ability to convert solar radiation, covering a broad range of wavelengths, to free carriers for generation of useable electricity. Further, a solar cell is provided having an efficiency with a theoretical limit of greater than 70%. Furthermore, a fabrication process is suggested for achieving this design which is easily scalable and relatively inexpensive compared to modern semiconductor fabrication technology.

In a more specific aspect, the photo-active region contains a plurality of clusters of semiconductor material of various sizes as described above. For the purposes of the invention, the clusters may be comprised of semiconductor atoms arranged in either crystalline or amorphous form. In this case, the term "amorphous" refers to any non-crystalline structure. Thus, the semiconductor clusters may be thought of as minute "clumps" of semiconductor material which may have either a crystalline or non-crystalline structure.

According to the invention, the semiconductor clusters are embedded in a conducting transparent matrix. Semiconductor clusters having a size of between about 8 and 100 Å are distributed across the thickness of the photo-active region by order of size. More specifically, the clusters are preferably arranged so that smaller clusters are generally closer to an upper light incident surface of the photo-active region, and larger clusters are distributed further away in increasing order of size. Thus, the largest clusters are distributed furthest away from the light incident surface.

Clusters within the range of cluster sizes are preferably formed so as to have a specific size and therefore a particular band-gap value corresponding to an energy level (or wavelength) of the photons of a portion of the incoming optical radiation. By providing a range of appropriately sized clusters distributed from smallest to largest across the thickness of the conducting transparent matrix, it is possible to maximize efficient conversion of optical radiation throughout the range of wavelengths incident on the photo-active region.

In a more specific aspect, the photo-active region described above may be incorporated into a solar cell. The solar cell is comprised of a pair of current collecting electrodes formed on opposite sides of the photo-active region for collecting electricity generated in the photo-active region. A first one of the current collecting electrodes is formed on the light incident surface of the photo-active region and is formed from a transparent conducting material. A second current collecting electrode is formed on a second surface of the photo-active region facing away from the light incident surface. The second current collecting electrode is also formed from a conducting material but does not need to be transparent.

A pair of insulating layers are preferably provided on or adjacent to the oppositely facing first and second current collecting electrodes to electrically insulate the current collecting electrodes from a pair of field electrodes as described below. A first insulating layer is positioned on the light incident surface of the first current electrode. The first insulating layer is also formed from a transparent material or substance to permit the passage of optical radiation therethrough. A second insulating layer is positioned on a surface of the second inner current collecting electrode facing in a direction opposite from the light incident surface of the photo-active region.

The field electrodes, which are conductive, are positioned on or adjacent to the oppositely facing first and second insulating layers. A first field electrode is formed on a light incident surface of the first insulating layer. The first field electrode is formed from a material which is generally transparent to optical radiation. A second field electrode is formed on or adjacent to a surface of the second insulating layer facing in a direction opposite from the light incident surface of the photo-active region.

In a separate embodiment of the invention, current collecting and field electrodes separated by appropriate insulating layers as described above, may be positioned along a perimeter of the surface of the photo-active region. In this embodiment, none of the electrodes need to be made from an optically transparent material because they do not generally block incident light from impinging upon the photo-active region.

DETAILED DESCRIPTION OF THE PREFERRED EMBODIMENTS

Figure 1:
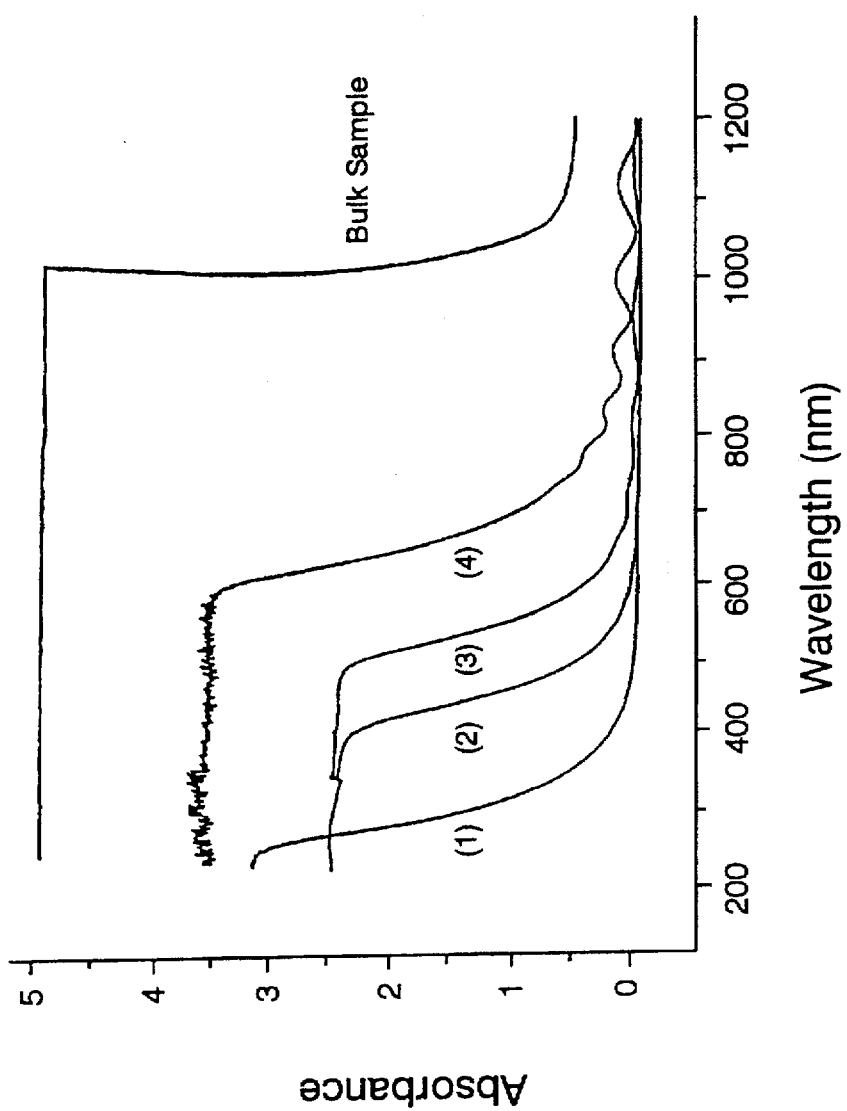
FIG. 1 is a plot of absorption curves showing the band-gaps of several samples containing isolated silicon clusters of different sizes.

According to the present invention, it has been discovered that semiconductor materials can be deposited on a substrate so as to form clusters of various microscopic sizes. Further, it has been discovered that such clusters of semiconductor material with sufficiently small diameters, in the range from about 5 to 200 Angstroms, will generally have different, higher band-gap energies as compared to bulk semiconductor materials. These higher band-gap values for appropriately sized semiconductor clusters result in absorption occurring in such clusters in a range of relatively shorter wavelengths as compared to bulk semiconductor materials. More specifically, it has been found that the band-gap energy of such clusters varies inversely with the square of the size of the clusters and can be controlled by varying cluster size within a given range. Likewise, the absorption wavelength also varies inversely with the square of the size of the clusters.

It has long been speculated that as one changes the size of semiconductors to small clusters, there will be a related change in band-gap energy. The amount of change and the range of energies possible has remained unknown. A small change and a limited range of band-gap energies has been observed in certain studies concerning CdS and CdSe semiconductors and in CdTe. (see e.g. Potter, B. G. Simons, J. H., Kumar, P., and Stanton, C. J., "Quantum-Size Effects on the Band Edge of CdTe Clusters in Glass, J. Appl. Phys., Vol. 75, pp. 8039–45, 1994). It has also been speculated, but not directly observed, that silicon and certain other semiconductors would exhibit the same behavior. Significantly, however, it has not previously been understood that band-gap energy shifts will occur in certain other types of semiconductors such as silicon or that the change in cluster size achievable by the disclosed methods would cause such a large shift of band-gap energies as illustrated in FIG. 1.

Further, measurements on CdTe semiconductors have yielded the surprising result that electron and hole carriers created in semiconductor clusters will diffuse into the surrounding matrix, when the preparation method can avoid the inclusion of interfacial impurities. It is anticipated that a similar result can be achieved with a transparent conducting matrix as will be described in greater detail below. The present invention makes use of both of these discoveries, i.e. the observed shift in band-gap energies over a substantial part of the solar radiation spectrum and the ability to collect the photo-generated carriers in a transparent conducting matrix, to enable the formation of (1) a highly efficient photo-active region for generating free carriers in response to solar or other broad band optical radiation, and (2) a solar cell incorporating such a photo-active region to collect and efficiently convert light to electricity over a major portion of the solar spectrum.

The change in band-gap energy associated with differently sized semiconductor clusters will now be described. In general, free charge carriers (electrons and holes) in semi-conductors exist in states that are described by a wave function associated with the carriers. These waves are similar to those that determine the orbits of bound electrons around a nucleus of an atom and control the allowed kinetic energies of the orbiting electrons. When the semiconductor clusters are large (greater than about 50 nanometers in diameter or thickness), i.e. bulk sizes, the carrier wave functions associated with the free carriers can extend over the entire mass of semiconductor material and are therefore not affected by the borders of the semiconductor. The existence of such carrier wave functions which can extend over the entire mass of material in the case of free carriers, establishes the energy difference between the bound and the free carriers, hence the band-gap energy. As the size of the semiconductor cluster is reduced, the free carrier wave functions are affected by the boundaries of the semiconductor and therefore undergo a degree of confinement. This confinement reduces their natural wavelength, consequently increasing their energies. This increase in energy of the free carriers raises the energy difference between the free and bound carriers, hence increasing the band-gap energy. Consequently, the small clusters give rise to a greater increase in band-gap energy.

Exemplary results of the foregoing discovery are shown in FIG. 1, which is a plot of absorption curves showing the band-gaps of several samples containing isolated clusters of silicon having a range of different sizes. The smaller clusters show an absorption onset (which corresponds to the band-gap) at shorter wavelengths as compared to bulk silicon.

In FIG. 1, the curve marked "bulk sample" shows an experimentally obtained absorption plot which is typical of current bulk silicon materials. Such bulk silicon material is capable of efficiently transforming optical radiation into electricity when the optical radiation has a wavelength of between approximately 950 and 1100 nm. Curves marked 1, 2, 3, and 4 demonstrate how the absorption wavelength can be altered by preparing samples of silicon clusters having different sizes. In sample 1, the cluster size is approximately 10 to 12 Angstroms and the efficient conversion region is between 200 and 350 nm. In sample 2, the cluster size is approximately 15 Angstroms and the efficient conversion region is between 350 and 500 nm. In sample 3, cluster size is approximately 18 Angstroms and the efficient conversion region is between 500 and 600 nm. In sample 4, cluster size is approximately 22 Angstroms and the efficient conversion region is between 600 and 800 nm. By fabricating a set of stacked layers which include silicon clusters corresponding to each of these samples, it is possible to have an efficient conversion from 200 nm to 1100 nm, covering a major part of the solar spectrum. Although silicon is used in the example shown in FIG. 1, the invention is not so limited and similar results can be obtained with other types of semiconductor materials such as germanium and cadmium telluride, regardless of whether such other semiconductors have a direct or indirect band-gap.

In a photo-active region to be utilized in a solar cell, it is desirable to be able to provide efficient conversion of optical radiation having wavelengths in the range from at least about 200 nm to 1100 nm, which includes the entire visible spectrum of light, along with the near ultraviolet and near infrared. Optical radiation in this range typically is comprised of photons having an energy of between about 4.2 eV and 0.59 eV, respectively. In order to permit optical radiation having such energy characteristics to be efficiently absorbed, it is necessary to form the photo-active region from a material having band-gap energy levels which are also in the range of about 4.2 eV and 0.56 eV.

In the case of silicon, empirical evidence indicates that band-gap values of between about 1.1 eV and 6.2 eV can be obtained from clusters having diameters ranging between approximately 100 Å and 8 Å. Germanium clusters of the same size range yield band-gap values between 0.70 and 6 eV. Cadmium telluride clusters of the same size range yield band-gap values between 1.5 and 2 eV (see Potter, B. G. Simmons, J. H., Kumar, P., and Stanton, C. J., "Quantum-Size Effects on the Band Edge of CdTe Clusters in Glass, J. Appl. Phys., vol. 75 pp. 8039–45, 1994).

Other semiconductor materials may also be used to form clusters of various sizes and having a range of band-gap energies corresponding to the energy level of incident optical radiation. In each, the relationship between cluster size and band-gap may appropriately be determined by those practiced in the art using the equation:

$$E(r)=E_0+AB/(mr^2)$$

in which E(r) is the band-gap energy associated with a cluster of radius "r", where "m" is the total mass of the exciton (electron and hole) and where "A" is a constant of value:

$A=4.5\times10^{-19}$ eVm$^2$; and

"B" is a materials sensitive coefficient increasing from a value of 1.

Based upon present empirical results, the band-gap values appear to remain the same for both amorphous and crystalline clusters.

In order to take advantage of the foregoing effect, a structure and method for manufacturing a photo-active region for use in a solar cell have been devised. In general terms, the invention comprises a photo-active region wherein semiconductor clusters are arranged in a conducting transparent matrix with the smaller clusters nearer the surface to be exposed to incident light and the larger clusters successively positioned further away. Because the band-gap energy is inversely related to the square of the size of the clusters, the resulting structure will necessarily result in the optical radiation being incident upon clusters with the highest band-gap energy first, followed by larger clusters as the incident light continues to penetrate the depths of the photo-active region. In this way, the optical radiation at decreasing energy levels may be successively absorbed as it passes through the increasingly larger clusters having lower band-gaps. Using the foregoing technique, it is possible to create photo-active regions and therefore solar cells which have efficiencies dramatically higher than those previously attainable.

Figure 2:
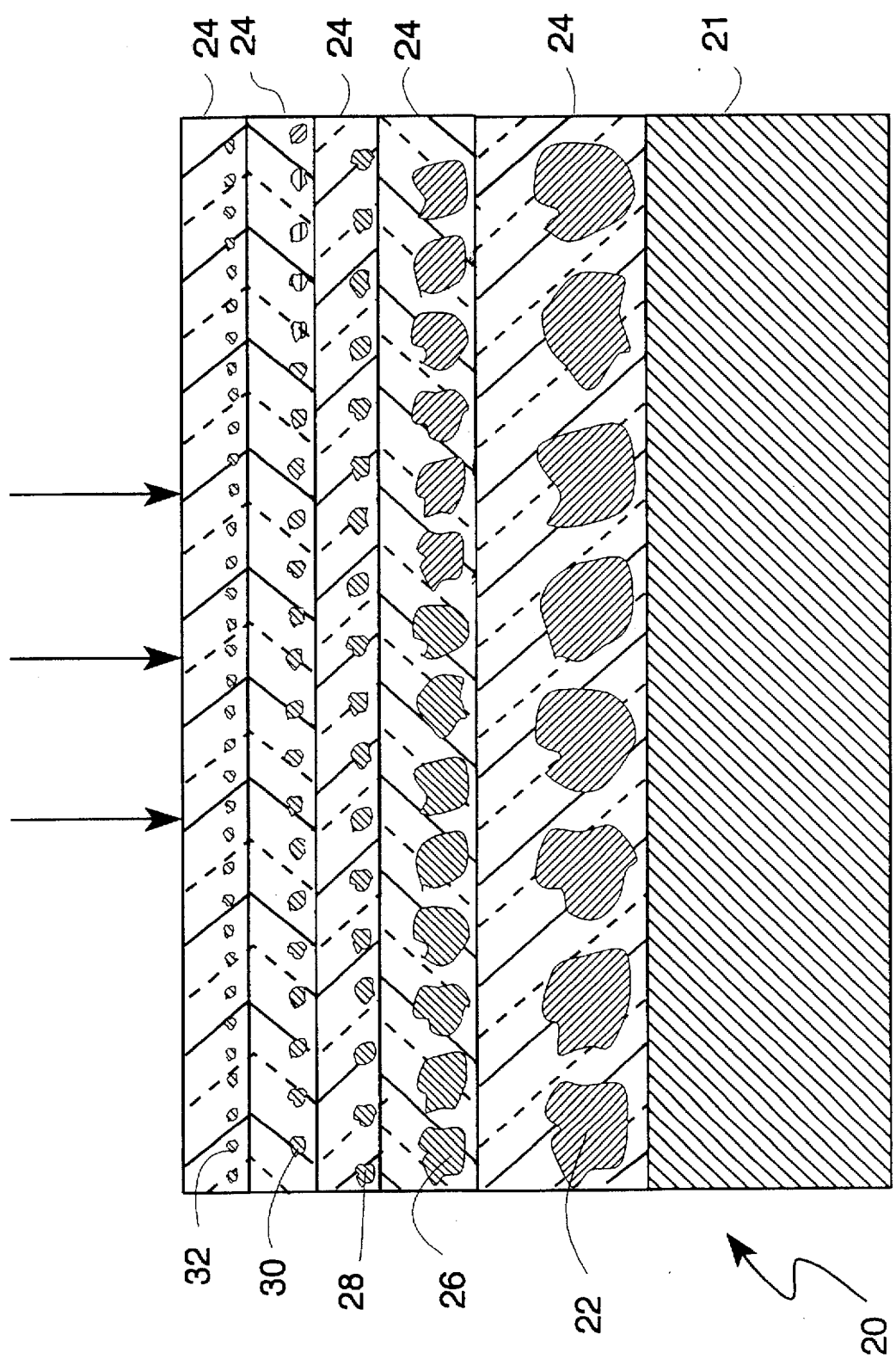
FIG. 2 is a cross sectional view of a photo-active region according to the present invention.

FIG. 2 shows one possible design for a photo-active region 20 which may be fabricated in accordance with the invention. As may be seen in FIG. 2, photo-active region 20 is comprised of a series of stacked layers. Reference numeral 22 refers to a base semiconductor cluster layer, which is preferably deposited upon a substrate material 21. The substrate 21 may be formed from any suitable material. The purpose of the substrate 21 is primarily to provide mechanical support for the photo-active region 20. The base semiconductor cluster layer 22 would normally contain the largest diameter semiconductor clusters and, in the case of silicon, is preferably of at least about 500 Angstroms diameter.

Reference numeral 24 refers to a conducting transparent matrix in which semiconductor cluster layers 22, 26, 28, 30, 32 are embedded. The conducting transparent matrix 24 is preferably applied over each of the semiconductor cluster layers and preferably extends approximately 100 to 200 Angstroms between adjacent layers of semiconductor clusters. Because semiconductor layers are formed of individual clusters, the conducting transparent matrix 24 necessarily fills the spaces surrounding such clusters so that the clusters are embedded therein.

For the purposes of the invention, the term "conducting transparent matrix" refers to the host material in which the semiconductor clusters are embedded, and having the ability to transmit, with essentially no loss, light of wavelength covering at least a portion of the range of solar radiation (e.g. from about 300 nm to about 1500 nm) and the ability to conduct electricity (electron and hole free carriers) with little resistance (e.g. less than about 0.001 Ohm-cm). The conducting transparent matrix may be formed from conducting glass or some other conducting transparent material. Other conducting transparent matrix materials which may be used for this purpose include fluorine-doped tin oxide, indium tin oxide, and zinc oxide.

As noted above, the semiconductor cluster layers 22, 26, 28, 30, 32 are embedded in the conducting transparent matrix 24. The clusters in each successive layer decrease in size in the direction of the light incident surface, with the result that the overall thickness of each cluster layer decreases with each successive layer in the direction of the incident light at film 32. As described in greater detail below, changing the total amount of semiconductor material deposited between films of the transparent matrix will directly affect the size of semiconductor clusters formed. As shown in FIG. 2, the layers of transparent matrix 24 are formed over each layer of clusters 22, 26, 28, 30. Thus, the transparent matrix layer actually fills the interstices of the cluster layers 22, 26, 28, 30, thereby completely embedding the semiconductor clusters comprising each layer within the transparent matrix. For clarity, only five layers of clusters are shown in FIG. 2 embedded in the transparent conducting matrix 24. It should be noted however that the invention is not limited in this regard and more or fewer layers may be added to ensure efficient conversion of incident optical radiation across a given range of wavelengths.

For the purposes of the present disclosure, specific reference shall be made to silicon type clusters, it being understood however that the invention may be used with a variety of different types of photo-responsive semiconductor materials. In the case of silicon, cluster layers above the base layer 22 preferably are comprised of clusters having a diameter ranging from between about 160 Angstroms for the film 26, to about 4 angstroms for the uppermost film 32. The resulting photo-active region 20, using silicon semiconductor clusters only, will have a band-gap range which spans from the bulk value of 1100 nm to roughly 200 nm, thereby covering the entire visible spectrum of light.

According to the invention, when optical radiation is incident upon the photo-active region 20, wavelengths near the band-gap of the smallest clusters in layer 32 will be absorbed first. Longer wavelengths will be transmitted through the clusters in layer 32 and the conducting transparent matrix 24 located immediately below. The wavelengths of the transmitted optical radiation which are near the band-gap of clusters in film 30 will then be absorbed by clusters in that layer. The optical radiation incident on the photo-active region 20 will continue passing through the various layers and will continue to be absorbed by clusters in subsequent layers when the band-gap of the clusters in that particular layer correspond to a wavelength present in the passing radiation. In this manner, the entire range of incident optical radiation may be efficiently absorbed for conversion into electricity.

Figure 3:
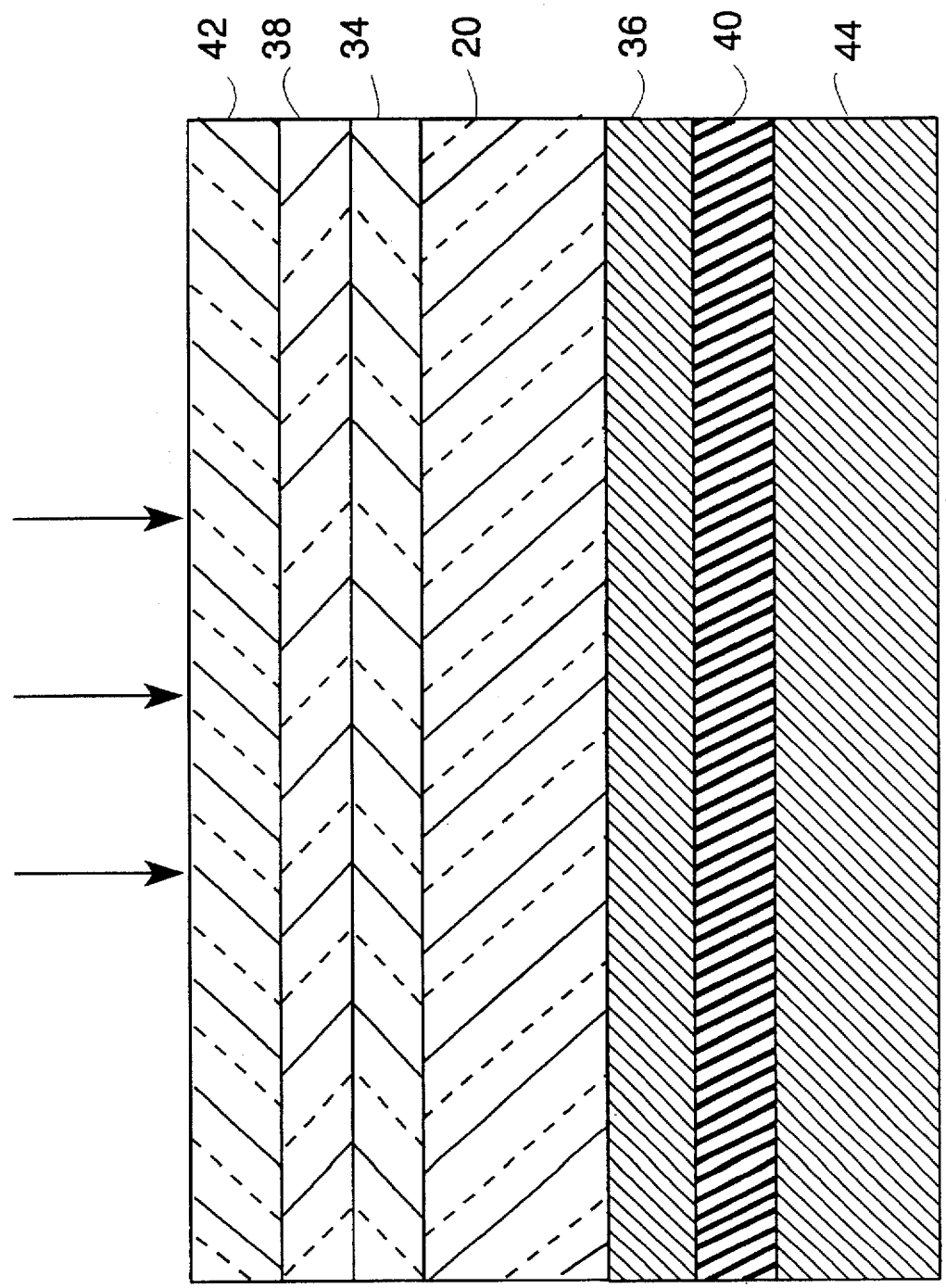
FIG. 3 is a cross sectional view of a photocell which may be used with the photo-active region according to the present invention.

FIG. 3 discloses one example of a design for a solar cell utilizing the photo-active region 20 in FIG. 2. As shown in FIG. 3, the solar cell includes a pair of inner current collecting electrodes 34, 36 which are provided for collecting the free carriers generated by light incident on the photo-active region. A pair of insulating layers 38, 40 are provided on the oppositely facing surfaces of the inner current collecting electrodes 34, 36. The insulating layers 38, 40 are provided to electrically insulate the current collecting electrodes 34, 36 from the outer field electrodes 42, 44. Field electrodes 42 and 44 are provided to apply an electric field to the photo-active region in order to drive the free carriers generated by incident optical radiation toward the inner current collecting electrodes 34, 36. By means of the electric field, the oppositely charged free carriers are diffused respectively to the inner current collecting electrodes 34, 36 in order to create the photo-voltage and photo-current of the cell.

The inner current collecting electrode 34 may be formed from indium tin oxide, fluorinated tin oxide, zinc oxide or any other suitable transparent conducting materials and glasses as are known to those skilled in the art. The inner current collecting electrode must be transparent because it is positioned on the light incident side of the solar cell and would otherwise block the passage of optical radiation to the photo-active region. The inner current collecting electrode 36 is formed on the lower surface of the photo-active region, and is also formed from a conducting material. In the case of the second inner current collecting electrode, however, transparency is not required because it is not positioned on the light incident side of the cell. Thus, the inner current collecting electrode 36 may be formed from the same materials as the inner current collecting electrode 34, or may be formed from other non-transparent conducting materials such as semiconductors or metals as are well known to those familiar with the art.

The transparent insulating layer 38 is formed on an upper surface of the transparent inner current electrode 34. Suitable material for the transparent insulating layer 38 would include high silica glass or any other transparent glass with high dielectric strength. High silica glass films consist of transparent glass films with the ability to transmit solar radiation with essentially no loss and high electrical insulating properties and high dielectric strength so that the films exhibit a resistance of at least 10,000 ohms across the thickness. Any other transparent insulating films with the same characteristics are also acceptable, and the invention is not limited in this regard. For example, magnesium fluoride or high dielectric constant glasses may be use for this purpose.

A second insulating layer 40 is formed on a surface of the inner current electrode, opposite from the inner current electrode 36. The insulating layer 40 may be formed from high silica glass, or any other suitable insulating material. Once again, because the second insulating layer is below the photo-active region, transparency is not required. Thus, the insulating layer 40 could also be formed from materials such as any other suitable insulating material as is well known to those of ordinary skill in the art.

Outer field electrode 42 is formed on an upper surface of the transparent insulating layer 38. The outer field electrode 42 is formed from a transparent conductive material which may be comprised of indium tin oxide, fluorinated tin oxide or zinc oxide. Outer field electrode 44 is formed on a lower surface of the insulating layer 40. Outer field electrode 44 may be formed from the same materials as the outer field electrode 42 or from any other suitable conducting type material as are familiar to those of ordinary skill in the art, including semiconductor substrate material. The outer field electrode 44 must be conducting. However, it is not necessary for the outer field electrode 44 to have the characteristic of optical transparency.

The various layers 34 through 44 comprising the solar cell may be applied as recited above using standard device fabrication techniques which are well known to those of ordinary skill in the semiconductor processing field. Preferred methods include RF sputtering, pulsed laser deposition, thermal evaporation, electron beam evaporation, cyclotron resonance, and chemical vapor deposition.

Figure 3A:
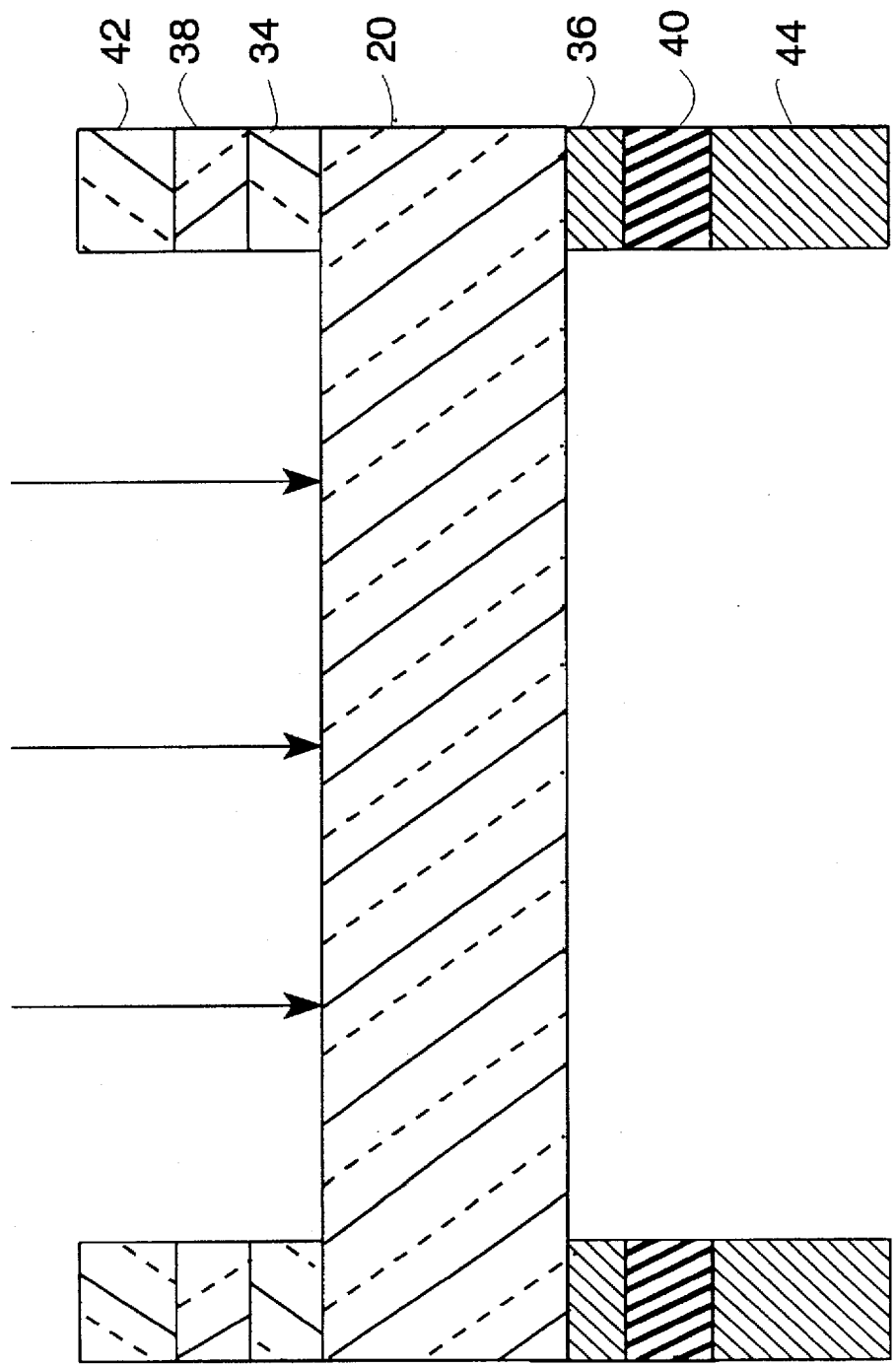
FIG. 3(A) is a cross sectional view of an alternative embodiment of the photocell of FIG. 3.

The above-described cell is one example of a solar cell which may be formed with the photoactive region of the invention. Significantly, however, the photoactive region according to the invention may also be used in any other design of cell where it is desired to increase the usable range of incident radiation which may be converted into electricity. For example, the electrodes and insulating layers do not have to lie across the entire surface of the photoactive region, but may be located at the perimeter instead. More particularly, rather than use above-described structures for the electrodes, it is possible to attach the inner current collecting electrodes, 34, 36, the insulating layers 38, 40 and the outer field electrodes 42, 44 on the perimeter of the photo-active region. An example of this alternative structure is shown in FIG. 3(A). In the embodiment of FIG. 3(A), it is apparent that transparency is no longer required of the electrode or insulating material since the electrodes and insulators are not in the path of the incident solar radiation intended to strike the photo-active region.

According to the invention, when the solar cell is exposed to light as shown in FIG. 3, light incident on its upper surface will pass through the various transparent layers 34, 38, and 42 and will thereafter penetrate semiconductor clusters comprising the upper-most layer 32 contained in photo-active region 20. That portion of the incident light having the shortest wavelengths and corresponding to the band-gap of the semiconductor clusters in layer 32, will be converted to free electron and hole carriers in those clusters comprising that layer. Shorter wavelengths will be absorbed efficiently near the top (or light incident side) of the photo-active region, by semiconductor clusters with band-gap energies comparable to the energy of the photons comprising such shorter wavelengths. Optical radiation having longer wavelengths will be transmitted through the layer 32, and conducting transparent matrix 24, to the next layer of semiconductor clusters 30. Longer wavelength light will be absorbed efficiently by the larger clusters having band-gap energies comparable to the photons comprising the longer wavelengths. In other words, as the incident optical radiation passes through successive layers of increasing diameter semiconductor clusters, that portion of the radiation having wavelengths corresponding to the band-gap of a particular cluster layer will be converted into free electron and hole pairs by clusters in that layer.

In the solar cell in FIG. 3, a D.C. electric field is applied to the first transparent outer field electrode 42 and the second outer field electrode 44. The D.C. electric field is provided to drive the photo-excited free carriers toward the proper inner current collecting electrode 34, 36. Free carriers formed in the photo-active region 20 are conducted to the electrodes by the transparent matrix. The precise voltage applied to the field electrodes is not critical, so long as it exceeds the band gap of the upper-most semiconductor layer (4–5 Volts) and does not exceed the breakdown voltage of the upper and lower insulating films. Likewise, the polarity of the required electric field is not limited by the structure of the device.

In the solar cell in FIG. 3, free carriers generated within each layer of semiconductor clusters are injected into the conducting transparent matrix. In this regard, reference is made to recently published data on quantum confinement effects in clusters of cadmium telluride semiconductor in a silica glass matrix ("Quantum-Size Effects on the Band Edge of CdTe Clusters in Glass", B. G. Potter, Jr., J. H. Simmons, P. Kumar and C. J. Stanton, Jr. Appl. Phys. 75, 8039–8045 (1994)). In these measurements, it was discovered that when RF sputtering deposition was used to form a layer of semiconductor clusters on an insulating glass matrix, free carriers produced in the semiconductor clusters were partially injected into the glass matrix. This result, using a strong insulator like silica glass, suggests that when a conducting transparent matrix is used, as in this invention, the free carriers will be efficiently injected into the transparent matrix layers. This can be shown mathematically using the relative band-gaps of the different materials.

According to the invention, as free carriers are photogenerated inside a semiconductor cluster, they are drawn to the edge of the cluster by the applied voltage on the outer field electrodes. According to the invention, it has been discovered that by fabricating a photo-active region 20 as disclosed herein, and avoiding the formation of impurity traps on the edge of the semiconductor cluster or in the matrix material, the photo-generated free carriers will be injected into the transparent matrix material. Impurity traps are materials with multiple valence states such as iron, copper, and other transition metals. Since the matrix material is made from conducting transparent matrix such as conductive glass, the photo-generated carriers are conducted toward the inner current collecting electrodes with the electrons driven toward the positive outer field electrode and the holes driven toward the negative outer field electrode. The free carriers (electrons and holes) will pass through the conducting transparent matrix surrounding all intervening layers of semiconductor clusters since the matrix material is continuous through all the cluster layers as described above. In this fashion, the free carriers will be transported through the adjacent cluster layers to the inner current electrodes.

According to the method of the invention, there are two techniques by which semiconductor clusters may be fabricated in the variety of small sizes required by the invention. According to a first method, it has been discovered that changing the total thickness, i.e. the total amount of material deposited to form the cluster layer on the glass matrix will directly affect the size of clusters formed. More specifically, it has been discovered that the cluster sizes are larger for the greater amount of material deposited. Any suitable method known to those in the semiconductor processing field may be used to apply the layers of semiconductor clusters on the layers of conducting transparent matrix. For example, the film may be deposited using RF sputtering, plasma deposition, thermal evaporation, electron-beam evaporation, electron cyclotron resonance or chemical vapor deposition.

The chart set forth below illustrates for silicon and cadmium telluride the approximate correlation between semiconductor cluster size, and absorption wavelength.

| Cluster Size | Absorption Wavelength |
|---|---|
| Silicon | |
| 8 Angstrom | 250 nm |
| 15 Angstrom | 450 nm |
| 18 Angstrom | 520 nm |
| 22 Angstrom | 650 nm |
| 30 Angstrom | 900 nm |
| 40 Angstrom | 1000 nm |
| Cadmium Telluride | |
| 24 Angstrom | 605 nm |
| 30 Angstrom | 611 nm |
| 43 Angstrom | 663 nm |
| 46 Angstrom | 705 nm |
| 66 Angstrom | 738 nm |
| 79 Angstrom | 752 nm |
| 85 Angstrom | 761 nm |
| 125 Angstrom | 795 nm |

According to a second method, it has been determined that heat treating the deposited semiconductor material at elevated temperatures, such as 600 degrees centigrade or higher, will alter the size of the deposited clusters. Heat treating in argon or nitrogen atmosphere tends to increase the size of the semiconductor clusters. However, heat treating in an oxygen atmosphere tends to reduce the cluster size for silicon and germanium clusters only and increases cluster sizes for CdTe, CdS and other semiconductors composed of elements from the second and sixth rows of the periodic chart, and semiconductors composed of elements from the third and fifth rows of the periodic chart. In general, heating the samples in chemically reducing gasses will increase the size of the clusters. Heating in oxidizing gasses will decrease the size of clusters of single element materials such as silicon and germanium, while it increases the size of clusters of compound semiconductors.

As to other types of semiconductors, it should be understood that while the specific recipe for heat treatment to obtain a specific result may not be readily predictable, it is readily determinable by experiment. Specifically, additional empirical studies may be employed to determine how a particular semiconductor will respond to heat treatment in a particular atmosphere.

Exemplary results of sizes obtained for CdTe clusters after heat treatments in an argon atmosphere are set forth below.

| Temperature | Duration | Average Cluster Size |
|---|---|---|
| 515 degrees C. | 1 hour | 24 A |
| 515 degrees C. | 2 hours | 30 A |
| 600 degrees C. | 1 hour | 43 A |
| 600 degrees C. | 1.6 hours | 66 A |
| 650 degrees C. | 2 hours | 85 A |
| 700 degrees C. | 4 hours | 125 A |

Ref. Potter et al. J. Appl. Physics vol 75, pp. 8039–45 (1994)

In the solar cell design according to the invention, the first of the above methods for forming semiconductor clusters is preferred since the cluster size of each layer can be controlled independently of the others by simply varying the amount of semiconductor material deposited in that particular cluster layer. The second method, involving heat treatment, may be implemented by placing the heater in the film formation chamber. Since the largest clusters are deposited first, they receive the longest accumulation of heat-treatment. This method is more effectively used as a fine tuning control for achieving properly sized clusters. Alternatively, the two methods can be used in combination with one another to precisely control cluster sizes.

Figure 4:
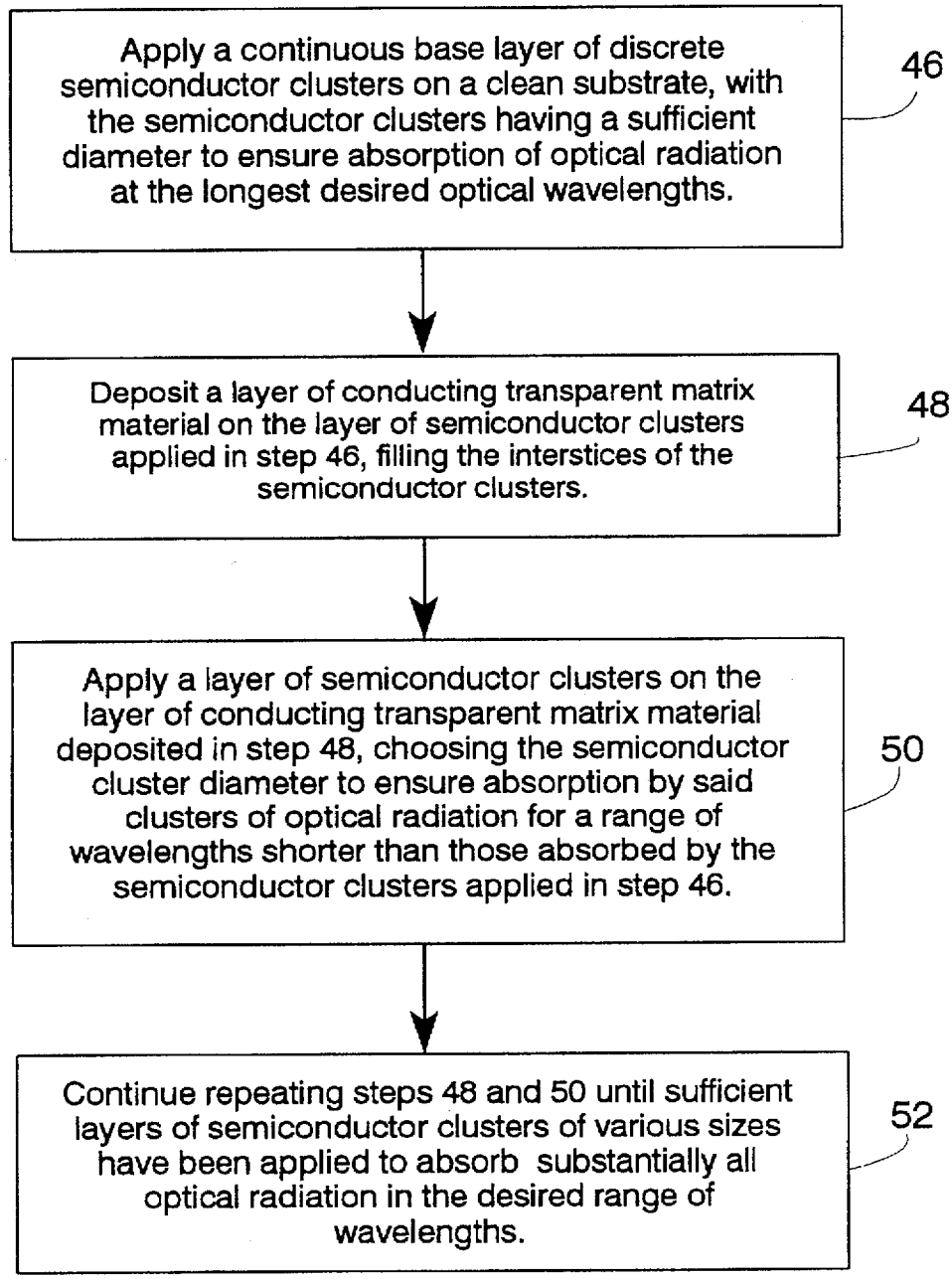
FIG. 4 is a flow-chart illustrating a method for fabricating a photo-active region as shown in FIG. 3.

FIG. 4 is a flow chart showing the method used to fabricate a photo-active region 20 wherein the semiconductor clusters are distributed from smallest near a light incident surface to largest near a lower substrate. As shown in FIG. 4, the step 46 requires first applying the largest desired semiconductor clusters to form a layer on a suitably prepared substrate. As noted above, application of the layer of semiconductor clusters can be effected by any of several methods which are well known to those in the semiconductor processing field. In the case of silicon, the base film is preferably at least about 500 Angstrom thick to ensure efficient conversion of the longest wavelengths of visible light. For other types of semiconductor materials, a base layer cluster size is preferably chosen sufficiently large so as to ensure that the band-gap value is about the same as the bulk value for that type of semiconductor material. Next, in step 48, a conducting transparent material is deposited on the surface of the base layer of semiconductor clusters. As noted above, the conducting transparent matrix is deposited so as to completely fill the interstices between the semiconductor clusters comprising the layer. The thickness of the conducting transparent material is preferably such that approximately 100–200 Angstroms of matrix material is deposited above semiconductor clusters in adjacent layers.

The conducting transparent material 24 is preferably applied to a thickness of approximately 100–200 Angstroms in order to provide sufficient conductivity to transport the photo-generated carriers to the inner current electrodes 34, 36. However, the exact thickness of the transparent matrix between adjacent cluster layers is not critical so long as it provides sufficient conductivity for carrier transport. For example, if the solar cell is very large in cross sectional area, and the electrodes are placed on the perimeter of the photo-active region 20 (see FIG. 2(A)), then it may be preferable to make the transparent matrix thicker, in order to reduce the matrix resistivity.

In step 50, another layer of semiconductor clusters is deposited. The size of the clusters deposited in step 50 is chosen so as to ensure efficient conversion of light into free carriers in the next higher range of wavelength required in a particular application. The process in step 52 is continued with successive application of transparent conducting material and semiconductor clusters until all optical ranges contained in the solar spectrum are adequately covered by appropriately sized films of semiconductor clusters. The deposited semiconductor clusters forming the layers are progressively reduced in cluster size from the lower-most layer to the upper-most layer (i.e. light incident layer) to efficiently convert increasingly shorter optical wavelengths.

The method set forth in FIG. 4 for forming a photo-active region may be used with any suitable type of semiconductor having the proper band-gap and an appropriately chosen transparent conducting film. In a further specific aspect according to the invention, a solar cell is provided which includes a plurality of groups of cluster layers advantageously chosen to be formed from two or more distinct types of semiconductor material. According to this embodiment of the invention, a single solar cell could use two or more photo-active regions comprised of different semiconductor cluster compositions. The distinct photo-active regions would be arranged in successive layers, so that the bandgaps at the shortest wavelength are closest to a light radiation source, while the longest wavelengths are furthest away. The region between the top and bottom of the photo-active region is arranged so that the shorter wavelength clusters are always above the longer wavelength clusters. This embodiment allows the selection of cluster compositions to cover the entire range of the useable solar spectrum.

Figure 5:
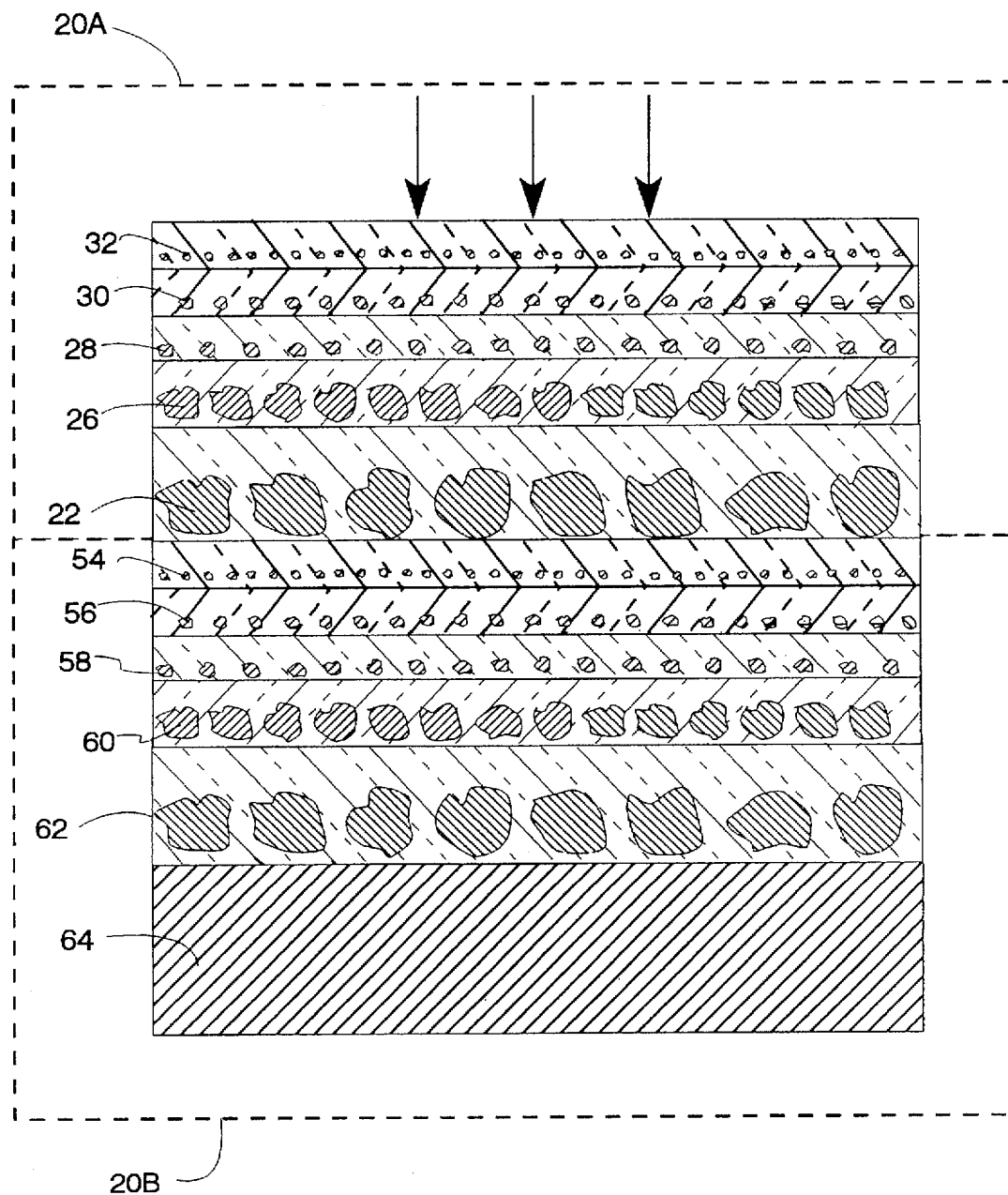
FIG. 5 is a cross-sectional view of a photo-active region according to the invention, which is comprised of clusters formed from two different types of semiconductors.

FIG. 5 shows one embodiment of the invention which advantageously makes use of a plurality of photo-active regions comprised of different types of semiconductor clusters. As shown in FIG. 5, the photo-active region may be comprised as described in FIG. 2, except that additional layers of semiconductor clusters 54, 56, 58, 60, 62, which are deposited from a second type of semiconductor material on a suitable substrate 64, are formed beneath the film layers 22, 26, 28, 30, 32. As in FIG. 2, the additional film layers in FIG. 5 are separated by a conducting transparent matrix 24, which is preferably about 100–200 Angstroms in thickness. In FIG. 5, the distinct photo-active regions formed from different types of semiconductor clusters are separately referenced as 20A and 20B to designate the semiconductor cluster layers associated with the two different types of material.

The additional semiconductor cluster films 54, 56, 58, 60, 62 are arranged relative to one another such that the clusters having band-gaps at shortest wavelength are at the uppermost, light incident surface, while the longest wavelengths (thickest films) are at the bottom of the group. The region between the top and bottom layers is arranged so that the clusters having band-gaps corresponding to the shortest clusters are always in layers above the clusters having band-gaps corresponding to longer wavelengths.

In FIG. 5, the semiconductor cluster layers 54, 56, 58, 60, 62 are shown below the cluster films comprising that portion of the photo-active region designated as 20A. It should be noted, however, that the invention is not so limited. In a preferred embodiment, the relative position of the cluster layers comprising 20A relative to the cluster layers comprising 20B is determined by placing the clusters with the smallest value band-gaps above those with the larger value band-gaps. It is clear in this embodiment that the placement of different layers of semiconductor clusters is chosen based upon relative band-gap wavelengths, i.e. shorter above longer, and that there need be no order by semiconductor composition.

The disclosed design offers a significant advantage over photo-active regions of the prior art. In particular, since the individual clusters are discrete from one another and not touching within the conducting transparent matrix layer, any lattice mismatch between films having different cluster compositions are taken up by the transparent matrix. Accordingly, the disclosed design suffers no impediment from the mixing of different cluster compositions as have some systems of the prior art.

I claim:

1. A photo-active region for generation of free carriers when optical radiation is present at a light incident surface, said photo-active region comprising:

a conducting transparent matrix;

clusters comprised of a semiconductor material embedded within said conducting transparent matrix, said clusters arranged in said matrix material so as to define at least one distribution of clusters ranging from smaller near said light incident surface of said photo-active region to larger near an oppositely facing second surface of said photo-active region.

2. The photo-active region according to claim 1, wherein said distribution of clusters ranges from those with higher bandgap energy and shorter bandgap wavelengths nearest to said light incident surface of said photo-active region, to clusters with lower bandgap energy and longer bandgap wavelength nearer said oppositely facing second surface of said photo-active region.

3. The photo-active region according to claim 1, wherein said conducting transparent matrix is formed from one of the group consisting of a conducting glass matrix, fluorine-doped tin oxide, indium tin oxide, and zinc oxide.

4. The photo-active region according to claim 1 wherein said clusters have band-gap values which span at least a portion of the range between 4.2 eV and 0.56 eV.

5. The photo-active region according to claim 1, wherein said clusters are formed from one of the group consisting of silicon, germanium, gallium arsenide, and cadmium telluride.

6. The photo-active region according to claim 1, wherein said clusters are formed from a semiconductor material selected from the group consisting of III-IV and II-XI compound semiconductors.

7. The photo-active region according to claim 1, wherein the sizes of said clusters range from between approximately 5 to 500 Angstroms.

8. The photo-active region according to claim 1, further comprising at least a second distribution of clusters embedded within said conducting transparent matrix, said second group of clusters arranged with said first group in said matrix material such that the clusters range from largest bandgap energy near said light incident surface of said photo-active region to those with the smaller bandgap energy near an oppositely facing second surface of said photo-active region, said second distribution of clusters formed from a second semiconductor material.

9. A photo-active region for generation of free carriers when exposed to a source of optical radiation, said photo-active region comprising:

a conducting transparent matrix;

a plurality of cluster layers, each of said layers being comprised of a plurality of discrete semiconductor clusters, said semiconductor clusters embedded in said conducting transparent matrix;

said semiconductor clusters contained within each of said cluster layers being generally smaller than those semiconductor clusters in the next lower cluster layer.

10. The photo-active region according to claim 9, wherein said semiconductor clusters range in diameter from between about 5 Angstroms and 500 Angstroms.

11. The photo-active region according to claim 9 wherein the distance between adjacent cluster layers is between about 20 and 200 Angstroms.

12. A photo-active region for generation of free carriers when exposed to a source of optical radiation, said photo-active region comprising:

a conducting transparent matrix having an upper surface for exposure to a source of optical radiation and an oppositely facing lower surface;

clusters of semiconductor material embedded within said conducting transparent matrix between said upper surface and said lower surface;

said clusters generally distributed between said upper and lower surface by order of size, said clusters generally increasing in size from smallest near the upper surface to largest near the lower surface.

13. A method of manufacturing a photo-active region comprising:

depositing on a substrate, a base layer of semiconductor clusters, said clusters having a diameter at least large enough so that the band-gap of said clusters is about the same as the band-gap of bulk material of the same type of semiconductor;

alternately applying layers of
(a) a conducting transparent matrix material, and
(b) selectively sized semiconductor clusters;

wherein the diameters of the deposited semiconductor clusters are progressively reduced in thickness from the base layer to an oppositely located light incident layer of semiconductor clusters.

14. The method according to claim 13 wherein said conducting transparent matrix is formed from one of the group consisting of a conducting glass matrix, fluorine-doped tin oxide, indium tin oxide, and zinc oxide.

15. The method according to claim 13 wherein said semiconductor clusters have band-gap values which span at least a portion of the range between about 4.2 eV and 0.56 eV.

16. The method according to claim 13, wherein said semiconductor clusters are formed from one of the group consisting of silicon, germanium, cadmium telluride, and gallium arsenide.

17. The method according to claim 13, wherein the diameters of said semiconductor clusters range from between approximately 5 to 500 Angstroms.

18. The method according to claim 13, wherein said conducting transparent matrix between adjacent cluster layers ranges in thickness from between about 20 and 200 Angstroms.

19. The method according to claim 13, wherein the size of said semiconductor clusters is adjusted by heat treatment.

20. The method according to claim 13, wherein the size of the semiconductor clusters is controlled by changing the total amount of semiconductor material deposited for each layer of semiconductor clusters.

21. A solar cell comprising:

a photo-active region containing a plurality of semiconductor clusters of varying sizes, said clusters embedded in a conducting transparent matrix;

said clusters generally arranged in said matrix material in a distribution of cluster sizes ranging from smaller near a light incident surface of said photo-active region, to larger near an oppositely facing second surface of said photo-active region;

a first current collecting electrode formed on said light incident surface of said photo-active region, said first current collecting electrode formed from a transparent conducting material;

a second current collecting electrode formed on said second surface of said photo-active region, said second current collecting electrode formed from a conducting material;

a first field electrode provided adjacent to said first inner current collecting electrode, said first field electrode formed from a transparent material; and a second field electrode provided adjacent to said second current collecting electrode;

a first insulating layer provided between said first current collecting electrode and said first, field electrode, said first insulating layer formed from a transparent material;

a second insulating layer provided between said second current collecting electrode and said second field electrode.

22. The solar cell according to claim 21, wherein a D.C. voltage is applied to said first and second field electrodes, to form an electric field across said photo-active region.

23. The solar cell according to claim 21, wherein at least said first current collecting electrode and, said first field electrode are formed from one of the group consisting of indium tin oxide, fluorinated tin oxide, and zinc oxide.

24. The solar cell according to claim 21, wherein at least said first insulating layer is formed from one of the group consisting of high silica glass, magnesium fluoride, and high dielectric constant glass.

25. A solar cell comprising:

a photo-active region containing a plurality of semiconductor clusters of varying sizes, said clusters embedded in a conducting transparent matrix;

said clusters generally arranged in said matrix material in a distribution of cluster sizes ranging from those with largest bandgap near a light incident surface of said photo-active region, to those with smaller bandgap near an oppositely facing second surface of said photo-active region;

current collecting electrode means for receiving positive and negative charge carriers generated in the photo-active region;

field electrode means for applying an electric field to said photo-active region to drive positive and negative charge carriers toward said current collecting electrode means;

insulating means for insulating said current collecting electrode means from said field electrode means.

* * * * *

UNITED STATES PATENT AND TRADEMARK OFFICE
CERTIFICATE OF CORRECTION

Patent No.    : 5,720,827

Issued        : February 24, 1998

Inventor(s)   : Joseph H. Simmons

It is certified that error appears in the above-identified patent and that said Letters Patent is hereby corrected as shown below:

Column 1, line 3,

Please insert the following:

-- <u>STATEMENT REGARDING FEDERALLY-SPONSORED RESEARCH OR DEVELOPMENT</u>

The subject invention was made with government support under a research project supported by U.S. Dept. of Energy Grant No. DE-FG05-91ER45462, and the U.S. Government has certain rights in this invention. --

Signed and Sealed this

Fourteenth Day of July, 1998

*Attest:*

BRUCE LEHMAN

*Attesting Officer*    *Commissioner of Patents and Trademarks*